United States Patent
Havanur

(10) Patent No.: US 8,207,017 B2
(45) Date of Patent: Jun. 26, 2012

(54) STACKED DUAL MOSFET PACKAGE

(75) Inventor: Sanjay Havanur, Cupertino, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 104 days.

(21) Appl. No.: 12/290,309

(22) Filed: Oct. 29, 2008

(65) Prior Publication Data

US 2009/0130799 A1    May 21, 2009

Related U.S. Application Data

(62) Division of application No. 11/518,546, filed on Sep. 7, 2006, now Pat. No. 7,485,954.

(51) Int. Cl.
*H01L 21/00* (2006.01)
*H01L 23/02* (2006.01)

(52) U.S. Cl. ......... 438/109; 257/500; 257/686; 257/787

(58) Field of Classification Search ........... 257/E21.499; 438/109
See application file for complete search history.

(56) References Cited

U.S. PATENT DOCUMENTS

2001/0052641 A1* 12/2001 Kuo et al. .............. 257/686
2007/0262346 A1* 11/2007 Otremba et al. ........ 257/177

* cited by examiner

*Primary Examiner* — Michael Lebentritt
*Assistant Examiner* — Raj R Gupta
(74) *Attorney, Agent, or Firm* — Jingming Cai; Schein & Cai LLP

(57) ABSTRACT

A method of fabricating a stacked dual MOSFET die package is disclosed. The method includes the steps of (a) forming a first conductive tab, (b) stacking a high side MOSFET die on the first conductive tab such that a drain contact of the high side MOSFET die is coupled to the first conductive tab, (c) stacking a second conductive tab in overlaying relationship to the high side MOSFET die such that a source contact of the high side MOSFET die is coupled to the second conductive tab, and (d) stacking a low side MOSFET die on the second conductive tab such that a drain contact of the low side MOSFET die is coupled to the second conductive tab.

9 Claims, 3 Drawing Sheets

STACKED DUAL MOSFET PACKAGE

CROSS REFERENCE TO RELATED APPLICATIONS

The present invention is a divisional application of application Ser. No. 11/518,546 filed on Sep. 7, 2006 now U.S. Pat. No. 7,485,954, the entire disclosure of which is herein incorporated in its entirety.

FIELD OF THE INVENTION

The present invention relates generally to power semiconductor packages and more particularly to a stacked dual MOSFET package.

BACKGROUND OF THE INVENTION

In switching circuits such as synchronous buck converters, half bridge converter and inverters, two power MOSFETs are switched in complementary fashion. As modeled in FIG. 1, a switching circuit generally designated 110, includes two MOSFETs 100 and 150 connected in series and across a voltage source 105. MOSFETs 100 and 150 are typically referred to as high side and low side MOSFETs respectively.

To initiate a switching cycle, the low side MOSFET 150 is first turned off. This forces the body diode of MOSFET 150 to turn on and drive the current. After a delay, the high side MOSFET 100 is turned on, forcing the body diode to turn off. However, the turn off process of the body diode results in an abrupt termination of its recovery current. This recovery current flows in the parasitic inductances LDHS, LSHS, LDLS, and LSLS as well as in trace inductances LTRCS, LTRCH and LTRCL of the switching circuit 110.

The abrupt termination of the current in these inductances leads to severe oscillations in the switching circuit 110, commonly known as ringing. The inductances in the switching path also slow down the switching speed and cause additional losses. As switching frequencies continue to increase, these losses become more significant, restricting the performance of the switching circuit 110.

A variety of prior art solutions exist to minimize the lead inductances. For example, some prior art solutions co-package the high side and low side MOSFETs and place the two dies side by side and connect them internally to the package with wire. Such co-packaging avoids some of the inductances in the traces outside but does not fully eliminate them.

It is known in the prior art to stack MOSFET dies one over the other with a metallic tab sandwiched between them. Examples include U.S. Pat. No. 6,777,786 to Estacio which discloses a semiconductor device including stacked dies mounted on a leadframe, U.S. Pat. No. 7,029,947 to Joshi which discloses a flip chip in leaded molded package with two dies, and US Patent Application Publication No. 2001/0052641 to Kuo et al. which discloses a power semiconductor device including upper and lower dies. While these references disclose staking MOSFET die, such stacking is restricted to a single MOSFET in a package with the aim of reducing the number of bond wires and manufacturing costs. Even though these solutions include the stacking of two dies, the top die is flipped so that the die can be ultimately connected together as a single MOSFET device. No attempt has been made in the prior art to stack dual MOSFETs operating in a complementary fashion.

There is therefore a need in the art for a stacked dual MOSFET package which overcomes the limitations of the prior art. There is also a need for a stacked dual MOSFET package for implementing circuits such as synchronous buck converters, half bridge converters and inverters having MOSFETs switched in complementary fashion. There is a further need for a stacked dual MOSFET package that minimizes the lead and interconnection inductances to a level not possible in the existing art. There is also a need for a stacked dual MOSFET package that provides higher efficiencies and reduced ringing during switching operation.

SUMMARY OF THE INVENTION

The present invention overcomes the limitations of the prior art and achieves its various objectives by providing a stacked dual MOSFET package in which a source of a high side MOSFET is internally shorted to a drain of a low side MOSFET at a switching or phase node which is brought out of the package. The package further includes lead outs for the high side MOSFET drain and gate and lead outs for the low side MOSFET gate and source.

In accordance with one aspect of the invention, a stacked dual MOSFET package includes a first conductive tab; a high side MOSFET die coupled to the first conductive tab such that a drain of the high side MOSFET die is electrically coupled to the first conductive tab; a second conductive tab electrically coupled to a source of the high side MOSFET die in overlaying relationship; a low side MOSFET die coupled to the second conductive tab such that a drain of the low side MOSFET die is electrically coupled to the second conductive tab; a first lead coupled to a gate of the high side MOSFET die; at least one second lead coupled to the drain of the high side MOSFET; at least one third lead coupled to a source of the low side MOSFET die; a fourth lead coupled to a gate of the low side MOSFET die; and an encapsulant covering portions of the first conductive tab, the high side MOSFET die, portions of the second conductive tab, the low side MOSFET die, and portions of the first lead, the at least one second lead, the at least one third lead, and the fourth lead.

In accordance with another aspect of the invention, a method of fabricating a stacked dual MOSFET package includes the steps of: forming a first conductive tab; stacking a high side MOSFET die on the first conductive tab such that a drain contact of the high side MOSFET die is coupled to the first conductive tab; stacking a second conductive tab in overlaying relationship to the high side MOSFET die such that a source contact of the high side MOSFET die is coupled to the second conductive tab; and stacking a low side MOSFET die on the second conductive tab such that a drain contact of the low side MOSFET die is coupled to the second conductive tab.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of functional components and to the arrangements of these components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The present disclosure may be better understood and its numerous features and advantages made apparent to those skilled in the art by referencing the accompanying drawings.

DETAILED DESCRIPTION OF THE INVENTION

Figure 1:
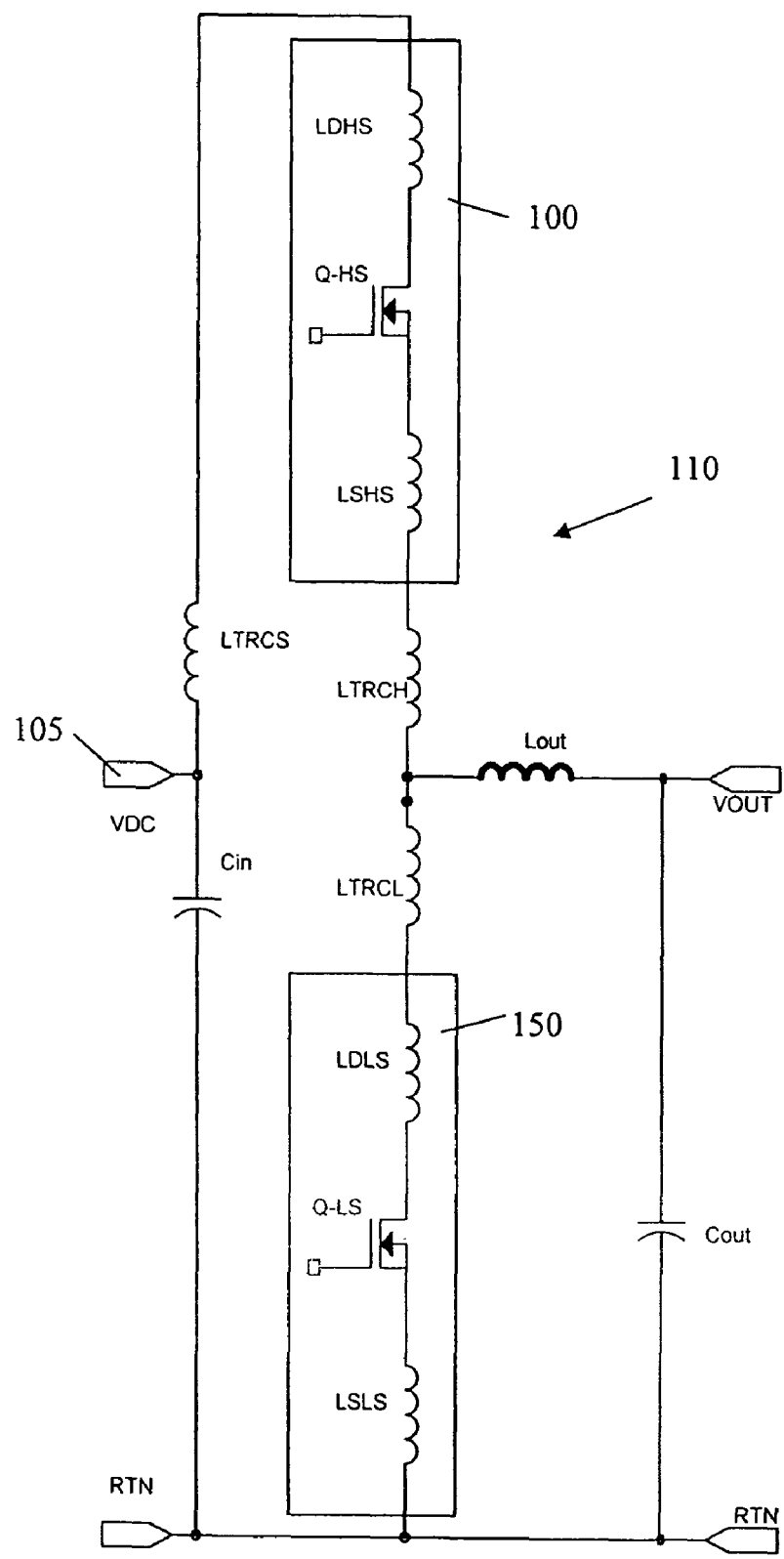
FIG. 1 is a prior art circuit model of a synchronous buck converter.
Figure 2:
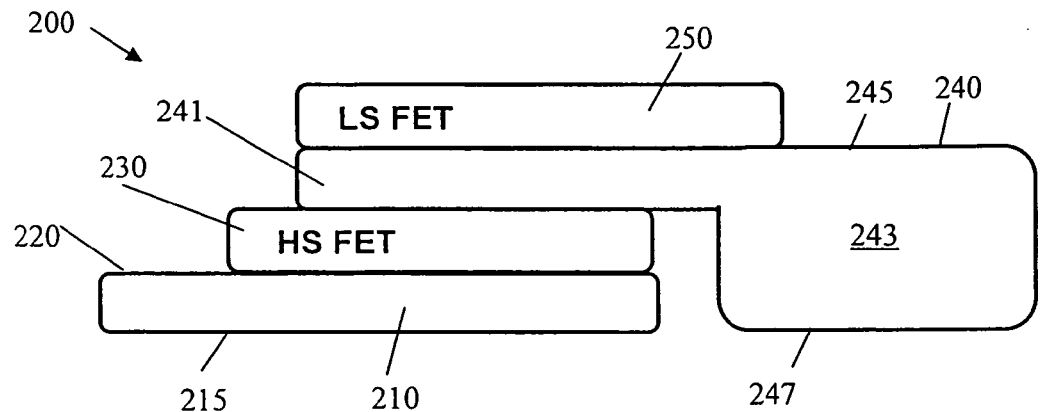
FIG. 2 is a side view of schematic representation of a stacked dual MOSFET package in accordance with the invention.

With reference to FIG. 2, a simplified representation of a stacked dual MOSFET package in accordance with the invention, generally designated 200, is shown including a metallic or other thermally conductive tab 210 having attached on a top surface 220 thereof a high side MOSFET die 230. A drain (not shown) of the high side MOSFET die 230 is electrically coupled to the conductive tab 210. Another metallic or similarly thermally conductive phase tab 240 is stacked on top of the high side MOSFET die 230 and attached to a source (not shown) of the high side MOSFET die 230. Phase tab 240 includes a thin portion 241 stacked on top of the high side MOSFET die 230 and a thicker portion 243.

A low side MOSFET die 250 is stacked on a top surface 245 of the conductive phase tab 240 such that a drain (not shown) of the low side MOSFET die 250 is electrically and thermally connected to the conductive tab 240. Bottom surfaces 215 and 247 of conductive tab 210 and conductive phase tab 240 respectively are shown disposed in a plane to provide two tabs at a bottom of the stacked dual MOSFET package. Conductive phase tab 240 carries heat from both the high side MOSFET die 230 and the low side MOSFET die 250.

Figure 3:
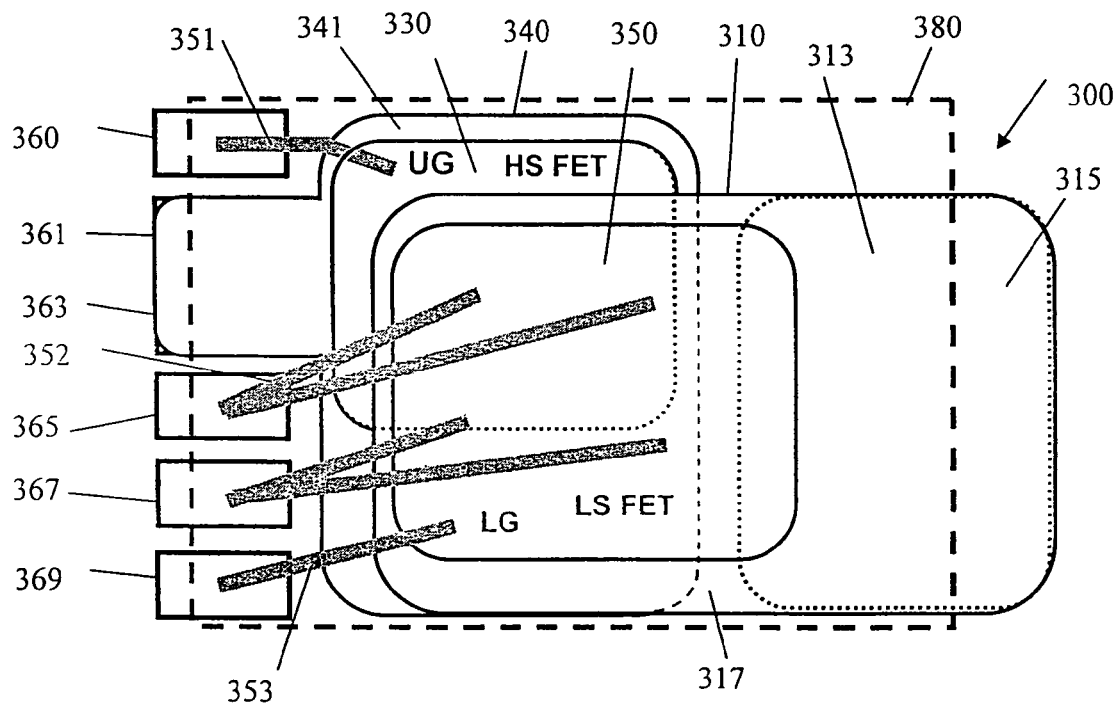
FIG. 3 is a top plan view of a schematic representation of the stacked dual MOSFET package in accordance with the invention.

With reference to FIG. 3, a preferred embodiment of a stacked dual MOSFET package generally designated 300 includes a metallic or similarly thermally conductive phase tab 310 having a first segment 313 having a bottom surface (not shown) flush with a bottom of the package 300. A portion 315 of the first segment 313 extends outside of a package encapsulant 380 and may be connected to a heat sink (not shown). A thinner second segment 317 of the phase tab 310 has a bottom surface (not shown) disposed in a plane above the bottom surface of the package 300 to accommodate a high side MOSFET die 330 and a Vin conductive tab 340 disposed thereunder.

Vin conductive tab 340 includes a bottom surface (not shown) in the plane of the bottom surface of the conductive phase tab 310. The high side MOSFET die 330 is electrically connected to a top surface 341 of the Vin conductive tab 340 such that a drain of the high side MOSFET die 330 is electrically coupled to the Vin conductive tab 340. The second segment 317 of the conductive phase tab 310 is disposed between a top of the high side MOSFET die 330 and the bottom surface of a low side MOSFET die 350 such that the source of the high side MOSFET die 330 is electrically coupled to the drain of the low side MOSFET die 350. The high side MOSFET die 330 is shown disposed in a staggered position in relation to the conductive phase tab 310 such that a high side MOSFET die gate contact is not covered by the conductive phase tab 310.

The stacked dual MOSFET package 300 may include a D-Pak or D2-PAK style package having a minimum of 4 pins. The drain of the high side MOSFET die 330 may be coupled to two leads 361 and 363 utilizing the Vin conductive tab 340. Leads 361 and 363 may be fused together as one lead as shown in this embodiment. The gate of the high side MOSFET die 330 may be coupled to a lead 360 using a conventional bond wire 351 or a conductive clip. A source contact of the low side MOSFET die 350 may be coupled to leads 365 and 367 by conventional bond wires 352 or conductive clips. A gate contact of the low side MOSFET die 350 may be coupled to lead 369 by a conventional bond wire 353 or a conductive clip.

Figure 4:
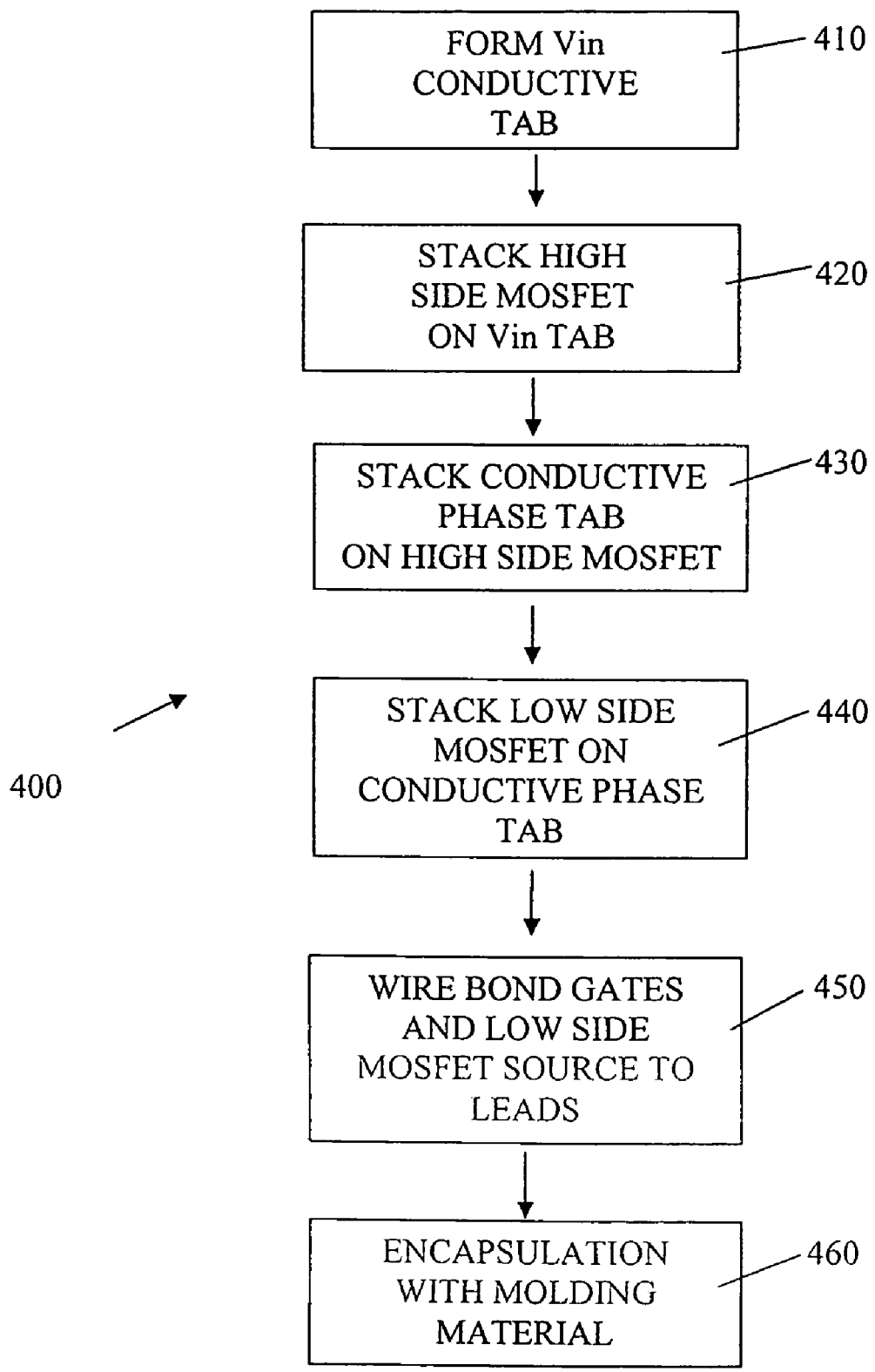
FIG. 4 is a flow chart of a method in accordance with the invention.

With reference to FIG. 4, a method generally designated 400 of fabricating the stacked dual MOSFET package in accordance with the invention includes a step 410 in which a Vin conductive tab is formed. In a step 420 a high side MOSFET die is stacked on the Vin conductive tab such that a drain of the high side MOSFET die is coupled to the Vin conductive tab. Solder paste or electrically conductive epoxy may be used to attach the high side MOSFET die to the Vin conductive tab. A conductive phase tab is stacked over the high side MOSFET die in a step 430 such that a source contact of the high side MOSFET die is coupled to the conductive phase tab. Solder paste or electrically conductive epoxy may be used to attach the conductive phase tab to the high side MOSFET die. In a step 440 a low side MOSFET die is stacked on the conductive phase tab such that a drain of the low side MOSFET die is coupled to the conductive phase tab. Solder paste or electrically conductive epoxy may be used to attach the low side MOSFET die to the conductive phase tab. Bond wires may be used to connect the high side MOSFET die gate and the low side MOSFET die source and gate to package leads in a subsequent step 450 followed by a final step 460 of encapsulation with molding material. The novel method 400 provides a package in which all power connections are made with zero inductance with the exception of the low side MOSFET die source connections.

By stacking the low and high side MOSFET dies one above the other and using a common tab as the phase node connection, most of the inductance associated with interconnection and lead wiring is eliminated. The dies used as the low and high side MOSFET dies may be both N-type, both P-type, or of complementary polarity. The MOSFET die parameters may be identical or asymmetrical in nature and optimized for high and low side switching. The low side MOSFET die may further include an integrated Schottky rectifier for further performance enhancement. The stacked MOSFET dies may be encapsulated in various plastic molds to form conventional packages including the D-PAK, D2-Pak, multi lead TO-220 or any other package design.

It should be understood, of course, that the foregoing relates to preferred embodiments of the invention and that modifications may be made without departing from the spirit and scope of the invention as set forth in the following claims.

I claim:

1. A method of fabricating a stacked dual MOSFET die package comprising the steps of:

forming a first conductive tab;

stacking a high side MOSFET die on the first conductive tab such that a drain contact of the high side MOSFET die is coupled to the first conductive tab;

stacking a second conductive tab in overlaying relationship to the high side MOSFET die such that a source contact of the high side MOSFET die is coupled to the second conductive tab, wherein the second conductive tab comprises a thin portion and a thick portion, wherein the thick portion has a top surface coplanar to a top surface of the thin portion; and stacking a low side MOSFET die on the second conductive tab such that a drain contact of the low side MOSFET die is coupled to the second conductive tab, wherein the first conductive tab and the second conductive tab are thermally conductive.

2. The method of claim 1, wherein the second conductive tab overlays the high side MOSFET die in such manner that a gate contact of the high side MOSFET die is exposed.

3. The method of claim 1, wherein the second conductive tab and the low side MOSFET die are stacked such that a first portion of the second conductive tab is between the high side MOSFET die and the low side MOSFET die, and a second portion of the second conductive tab extends laterally outward from the high side MOSFET die and the low side MOSFET die.

4. The method of claim 1, further comprising encapsulating the first conductive tab, the high side MOSFET die, the low side MOSFET die, and a portion of the second conductive tab.

5. The method of claim 1, wherein the thin portion overlays the high side MOSFET die.

6. The method of claim 1, wherein the second conductive tab comprises the thick portion having a portion in a different plane than the thin portion.

7. The method of claim 1, wherein the second conductive tab comprises a thin portion and a thick portion, the thick portion having a bottom surface disposed in a same plane as a bottom surface of the first conductive tab.

8. The method of claim 7, wherein the thick portion bottom surface and the bottom surface of the first conductive tab comprise two conductive tabs.

9. The method of claim 8, wherein the two conductive tabs are exposed through a bottom of a package encapsulant.

\* \* \* \* \*